United States Patent

Bachowski et al.

[11] Patent Number: 5,431,125
[45] Date of Patent: Jul. 11, 1995

[54] TWIN-FREE CRYSTAL GROWTH OF III-V SEMICONDUCTOR MATERIAL

[75] Inventors: Stephen Bachowski, Woburn; David F. Bliss, Arlington, both of Mass.; Robert M. Hilton, Chelmsford, Mo.

[73] Assignee: The United States of America as represented by the Secretary of the Air Force, Washington, D.C.

[21] Appl. No.: 715,166

[22] Filed: Jun. 14, 1991

[51] Int. Cl.⁶ .............................. C30B 15/26
[52] U.S. Cl. .............................. 117/17; 117/13
[58] Field of Search .......... 156/600, 601, 617.1, 156/618.1, 620.2, DIG. 70; 117/13, 14, 17, 21, 937

[56] References Cited

U.S. PATENT DOCUMENTS

| | | | |
|---|---|---|---|
| 4,217,167 | 8/1980 | Austerman | 156/624 |
| 4,299,650 | 11/1981 | Bonner | 156/617 SP |
| 4,299,651 | 11/1981 | Bonner | 156/620.2 |
| 4,528,061 | 7/1985 | Miyazawa et al. | 156/620.2 |
| 4,609,530 | 9/1986 | Morioka et al. | 420/555 |
| 4,684,515 | 8/1987 | Kawasaki et al. | 423/495 |
| 4,710,258 | 12/1987 | Latka | 156/617.1 |
| 4,783,235 | 11/1988 | Morioka et al. | 156/620.2 |
| 4,870,032 | 9/1989 | Johnston, Jr. et al. | 437/84 |
| 4,904,039 | 2/1990 | Soref | 350/96.14 |

OTHER PUBLICATIONS

Bachmann, et al., "Liquid Encapsulated Czochralski Pulling of InP Crystals," vol. 4, No. 2, 1975, pp. 389-406.
Bonner, W. A., "InP Synthesis and LEC Growth of Twin-Free Crystals," vol. 5 (1981), pp. 21-31.

Primary Examiner—R. Bruce Breneman
Assistant Examiner—FeLisa Garrett
Attorney, Agent, or Firm—Donald J. Singer; Stanton E. Collier

[57] ABSTRACT

Twin-free (100) InP crystals of large dimensions and having flat crowns are produced by combining the magnetic liquid encapsulated Kyropoulos (MLEK) process and the magnetic liquid encapsulated Czochralski (MLEC) process. Observation of the flat crown by high intensity light ensures twin-free growth in the magnetic environment.

14 Claims, 4 Drawing Sheets

TWIN-FREE CRYSTAL GROWTH OF III-V SEMICONDUCTOR MATERIAL

STATEMENT OF GOVERNMENT INTEREST

The invention described herein may be manufactured and used by or for the Government for governmental purposes without the payment of any royalty thereon.

BACKGROUND OF THE INVENTION

The present invention relates to semiconductor crystals, and, in particular, to indium phosphide bulk crystals, and, more particularly, to a method of growing twin-free crystals of the same.

One method of growing twin-free indium phosphide involves growth in the (111) direction using a growing angle less than 19.68 degrees from the vertical direction. The crystal produced by this method takes several hours to grow using the Liquid Encapsulated Czochralski process. The crystal has a long cone shaped upper portion and a significant amount must be wasted in cutting at 54 degrees to the growth plane to obtain (100) wafers necessary for device fabrication. U.S. Pat. No. 4,299,650 and U.S. Pat. No. 4,299,651 are incorporated by reference and also Bonner, W. A. "InP Synthesis and LEC Growth of Twin-Free Crystals," Journal of Crystal Growth, Vol. 54, 1981, pp 21-31.

Difficulties in forming twin-free InP in the (100) direction is related to crystallographic facets and the formation of small bubbles which appeared in the melt. These small bubbles are collected by the shear between the two melts and migrate to the outside edge of the crystal melt interface where they then attach to a growing facet to produce twins. The following article is incorporated by reference: Bachmann et al., "Liquid Encapsulated Czochraski Pulling of InP Crystal," Journal of Electronic Materials, Vol, 4, No. 2, 1975, pp. 389–406.

Thus there is a need for developing a method of producing bulk InP cystals having maximum useful wafers.

SUMMARY OF THE INVENTION

The present invention is a method for growing large diameter, twin-free indium phosphide crystals having a (100) orientation.

In the method, the melt is contained in a large crystal growth furnace having the ability to apply large magnetic fields to the melt. In a large melt, in the past, turbulence carried by natural convection destabilized the crystal-melt interface and promoted twin formation. The method of the present invention combines features of the magnetic liquid encapsulated Kyropoulos (MLEK) technique and the magnetic liquid encapsulated Czochralski (MLEC) technique. In general a (100) oriented seed is placed in the melt under the encapsulant where it is allowed to grow without upward lift to develop a flat crown. The melt is subject to a high magnetic field which dampens the convective flow about the crystal-melt interface. After the crown has developed sufficiently, the crystal is pulled from the melt/encapsulant while growth is still occurring. The crystal is rotated during the whole process. During the development of the crown, observation of the surface of the crown reveals if twins are there and, if so, the crystal is remelted and grown again. To enable this, high intensity light is projected at the specular surface of the crown during growth so that reflected light will reach the viewing port. While the growing crystal is rotating any twins will deflect the light thus highlighting their existence. If observed, the twinned portion is backmelted and regrown to be twin-free. In combination with the MLEK/MLEC technique and twin detection, twin-free boules can be routinely grown.

It is therefore one object of the present invention to provide a method of growing twin-free III–V semiconductor boules.

Another object of the present invention is to provide a method of growing twin-free indium phosphide, repeatedly.

Another object of the present invention is to provide a method of growing InP in a reproducible manner.

Another object of the present invention is to provide a method of growing InP with a flat crown in the (100) direction.

Another object of the present invention is to provide a method of growing twin-free (100) InP crystals with a MLEK/MLEC process adapted to backmelt the growing crystal if twins are thereon.

These and many other objects and advantages of the present invention will be readily apparent to one skilled in the pertinent art from the following detailed description of a preferred embodiment of the invention and the related drawings.

DESCRIPTION OF THE PREFERRED EMBODIMENT

The present invention produces twin-free, large diameter indium phosphide (InP) crystals using a combined liquid encapsulated Kyropoulos (LEK)/liquid encapsulated Czochralski (LEC) process with an axial magnetic field therein.

InP crystals have been grown by the liquid encapsulated Czochralski (LEC) technique since 1975 and more recently by liquid encapsulated Kyropoulos (LEK) technique. Both techniques have been demonstrated to produce high quality indium phosphide for research in photonic and microwave device applications. But because of the low yield of twin-free (100) crystals, and the resulting high cost of wafers, commercial development of InP based devices has been constrained. The twinning problem is inherent to InP, which has a low stacking fault energy; unless the correct angle is maintained at the solid liquid interface during growth there is high probability of twinning on the (111) growth facets. Twinning probability is further increased by turbulent convection in the melt which makes interface shape control nearly impossible. By stabilizing convective flows with a magnetic field and controlling the angle between the solid and liquid, one can grow large diameter twin-free InP crystals; they are shaped with a flat top as is typical for Czochralski growth. This shaping method has the fortuitous benefit that it maximizes the number of single crystal wafers which can be sliced from the boule. Combining magnetic liquid encapsulated Kyropoulos (MLEK) with magnetic liquid encapsulated Czochralski (MLEC), the crystal is grown with a flat top roughly two inches in diameter, and then slowly pulled as a cylinder 60 mm in length.

Figure 1:
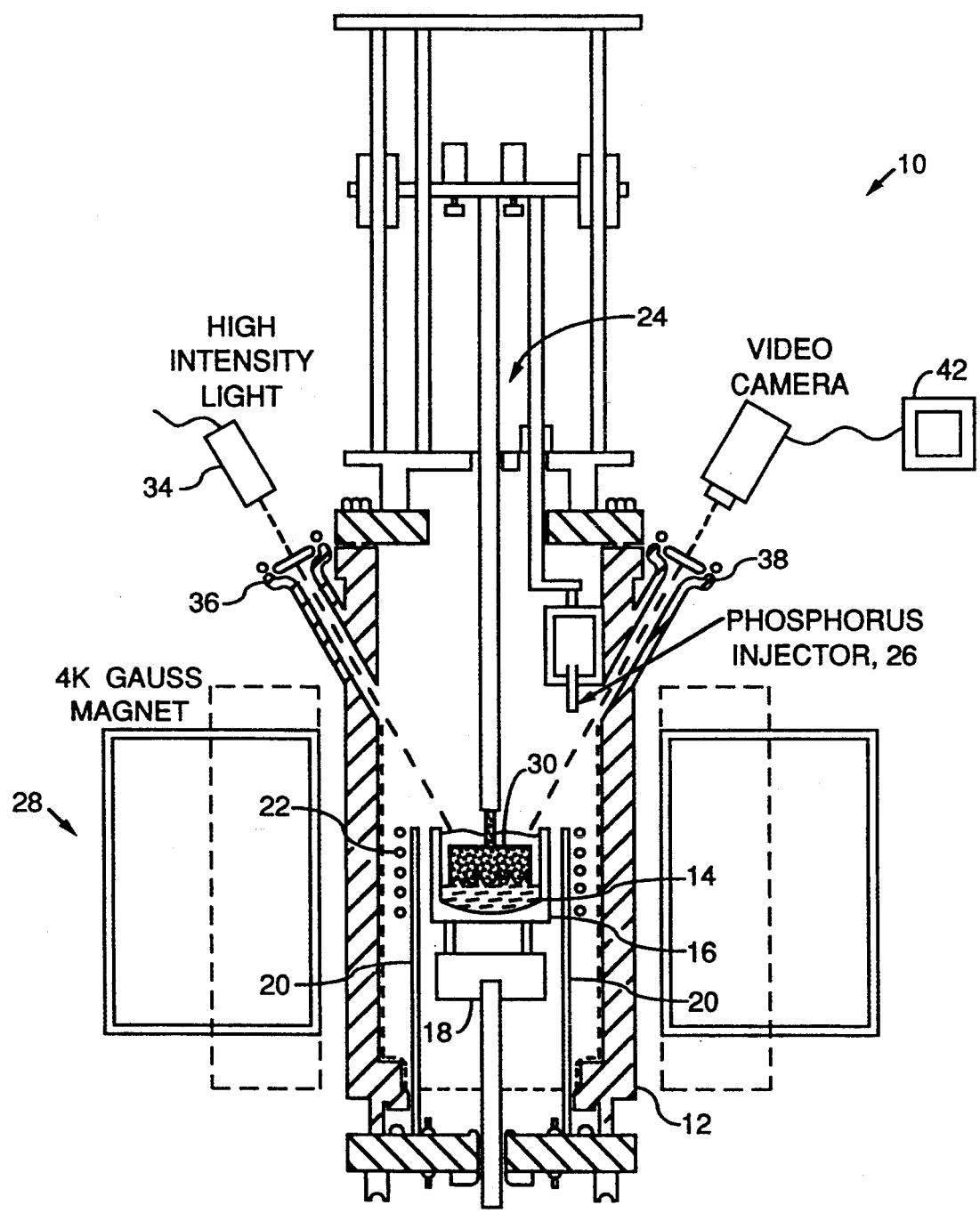
FIG. 1 illustrates the apparatus of the present invention.

Referring to FIG. 1, a crystal growth furnace 10 uses a non-magnetic stainless steel chamber 12 to contain the growth environment. A selected melt 14 is held by a crucible 16 on a pedestal 18 being surrounded by a susceptor 20 with RF heating coils 22 thereabout. A seed holding apparatus 24 is able to rotate, translate and provide cooling to a seed attached thereon. For indium phosphide (InP) growth, a phosphorous injector 26 is located on the chamber 12. In order to control turbulent convections a large torroidal magnet 28 provides an axial magnetic field up to 4K gauss (G) at the center of the hot zone. In order to observe a top 30, FIGS. 1 and 2, of an InP crystal 32, a high intensity light source 34 inputs light through a viewing port 36 which reflects off the top 30 into a viewing port 38 with a video camera 40 thereon which has a video monitor 42 for viewing the top 30 of the crystal 32.

Figure 2:
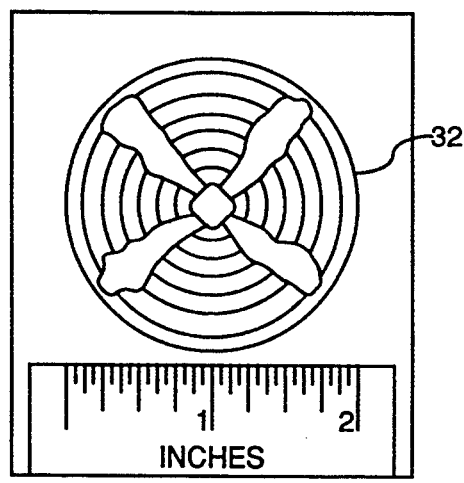
FIG. 2 illustrates by top view the flat crown of the InP of the present invention.

A fused quartz crucible 16, for example, about 70 mm in diameter and 65 mm high, contains about 550 grams of pre-synthesized stoichiometric InP prepared by etching in 2 percent bromine methanol solution. The InP charge is placed in the furnace 10 along with 80 grams of dry boron oxide. The furnace 10 is evacuated and pressurized with 550 psi of $N_2$. Once melted, a (100) seed, 6 mm square, is dipped into the melt 14. Seed rotation is about 4 rpm and a 2000 Gauss axial magnetic field is applied. A two inch flat crown is grown over about 60 minutes period by increasing the cool water flow through the seed holding apparatus 24 and decreasing the RF power. During this phase, no pulling occurs. A high intensity light from source 36 is shined onto the top 30 of the crystal 32 to observe twin formation. Twins are easily detected by viewing the reflected light off the flat crystal crown 30. FIG. 2 shows the appearance of the InP single crystal 32 when viewed from above. When a twin is detected, the crystal 32 is backmelted and a new crystal is grown. When viewing a specular surface, it is easier to detect twins on this flat surface than on a typical convex surface of a LEC crystal. In this manner twin-free crystals can be repeatably grown. After the crown was formed, the pull rate was set at 12 mm/hr and the crystal was pulled to completion without twins.

Figure 3:
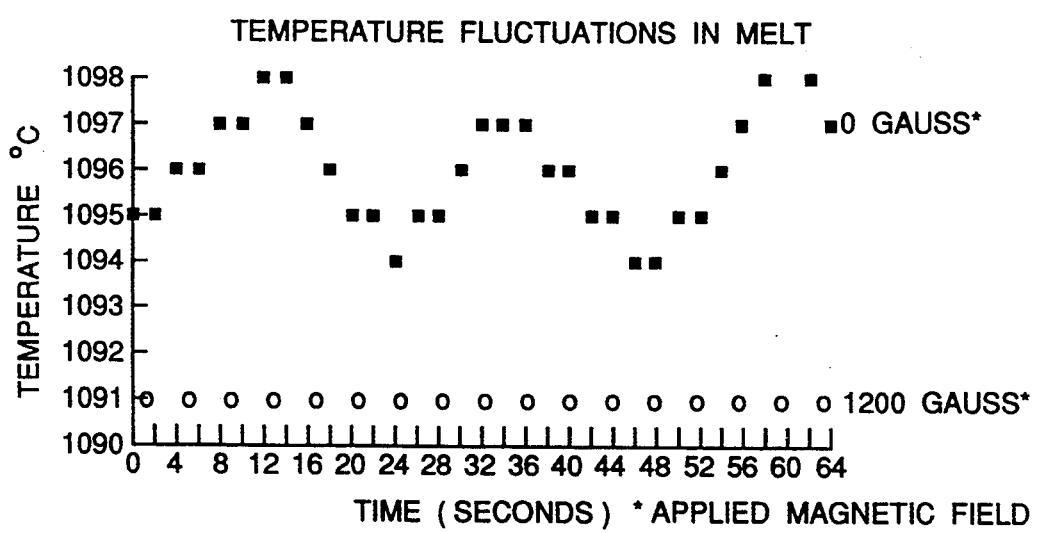
FIG. 3 illustrates temperature fluctuations in the melt, with or without an applied magnetic field.
Figure 4:
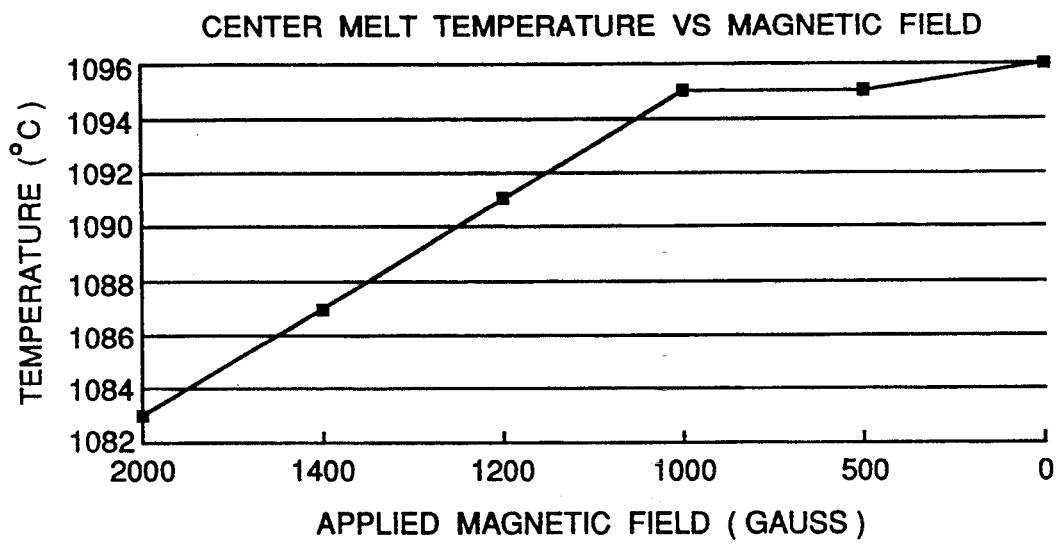
FIG. 4 illustrates the temperature in the melt as function of applied magnetic field.

A thermocouple fixture, not shown, attached to the seed shaft, was used to measure the thermal environment for the MLEK system. Two thermocouples encapsulated in quartz tubes are inserted into the melt, one at the crucible center and one near the edge. In the absence of an applied magnetic field, temperature oscillations are observed at the melt center on 20–25 second intervals (FIG. 3). When a magnetic field is applied, there is no noticeable change until the field strength reached 1 kG. As the magnetic field is increased above 1 kG the center temperature decreased monotonically, and the oscillations are stabilized. At 1.2 kG no periodic temperature fluctuations are observed and the center temperature is suppressed 4–5 degrees. Temperature reduction continues as the magnetic field is increased up to 2 kG where the temperature levels off. (See FIG. 4.)

Figure 5:
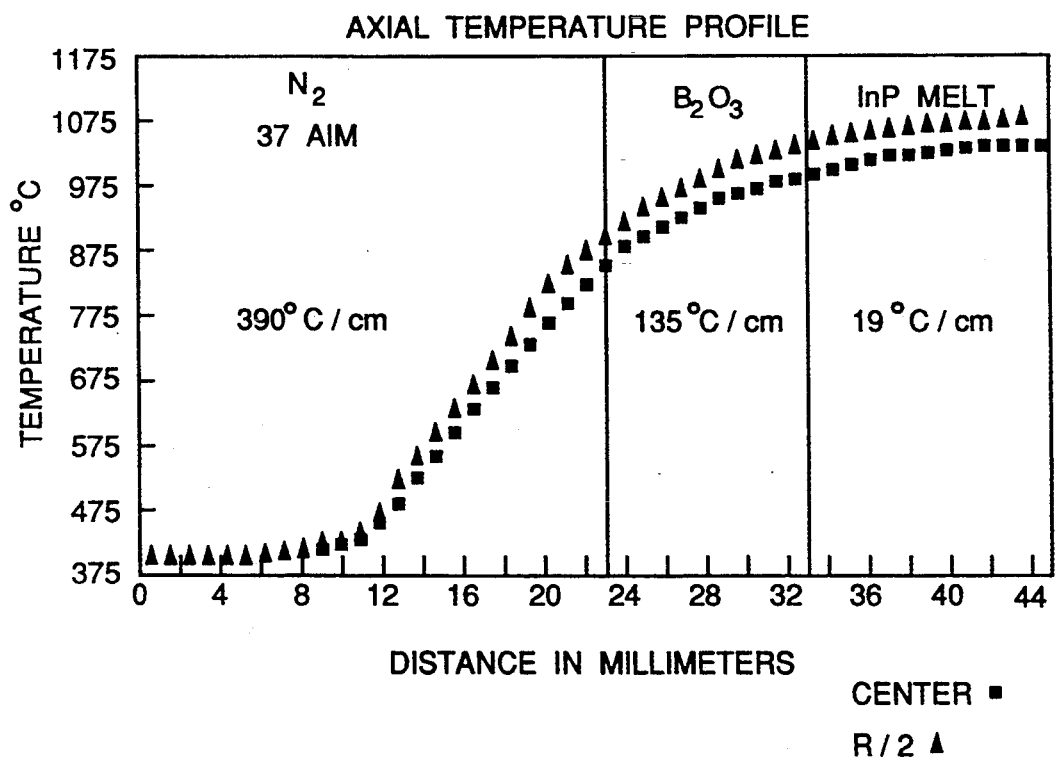
FIG. 5 illustrates axial temperature in the apparatus of FIG. 1.

Sufficient time is allowed for the system to reach equilibrium at each field strength before measuring the center temperature. The thermocouples were lifted slowly up through the melt and $B_2O_3$ encapsulant to record the thermal environment. FIG. 5 shows the axial thermal gradient as measured by the two thermocouples.

The applied magnetic field is responsible for increasing the radial temperature gradient and for suppressing turbulent convection in the melt. Both effects contribute to the stability of crystal growth. Since this method relies on heat extraction through the seed to initiate single crystal growth, a steep radial gradient assures heat flow in the direction of the seed. The crystal grows below the encapsulant in the melt where the axial gradient is relatively shallow. Compared to Czochralski crystals pulled up through the $B_2O_3$ at 135° C./cm, these crystals are grown in a 19° C./cm axial gradient. With such a shallow gradient at the solid-liquid interface magnetic stabilization is required to avoid turbulent melt flow.

Controlling the thermal geometry of the crystal growth environment makes it possible to grow (100) InP by the present invention. There are several advantages for MLEK growth of twin-free InP crystals: (1) Random temperature fluctuations are reduced to less than 1° C. when the applied magnetic field exceeds 1 kG (2). The magnetic field imposes a steeper radial gradient than exists in the non-magnetically stabilized melt. (3) Heat flow from the melt can be directed vertically by controlling the seed temperature $T_o$. These three factors contribute to an ellipsoid shaped solid-liquid interface with an aspect ratio close to unity.

The shape of crystals grown by this technique can be explained on a simple heat or mass transfer approach. The shape of the growing crystal can be described as an ellipsoid of rotation, a shape for which there is a solution to the heat flow equation under certain boundary conditions. In the case where the submerged end of the seed is held at constant temperature under stationary conditions, the shape is explained by heat flow through the seed. One can solve the steady state heat conduction equation for the case where no heat is being generated at the interface. The seed has a radius $r=R$ and is held at a temperature $T=T_o$ at the interface where $z=0$. The boundary conditions for these conditions are:

$$T = T_o \text{ for } Z = 0, 0 \leq I \leq R.$$

$$\frac{\delta T}{\delta Z} = 0 \text{ for } Z = 0, r \geq R.$$

The equation of heat flow $$Q = \frac{\delta^2 T}{\delta Z^2} + \frac{1}{r}\frac{\delta T}{\delta r} + \frac{\delta^2 T}{\delta r^2} + 0$$

can be solved numerically for an value of seed temperature $T_o$. The interface between the solid and the melt is assumed to be at the melting temperature $T_m$. The Newtonian heat loss through the seed is $$Q = 4kRT'$$

where $T'$ is the temperature gradient as modified by the aspect ratio of the ellipsoid, the parameter R/S.

$$T = \frac{T_m - T_0}{1 - \frac{2}{\pi} \arcsin \frac{R}{S}}$$

Although the amount of heat lost by conduction through the seed is relatively small compared to the heat lost to the ambient above the melt, the direction of heat flow is determined by the seed temperature $T_o$. Controlling this temperature is especially important where the crystal is grown at high ambient pressure. The shape of the ellipsoid is determined by a competition between the two heat transfer mechanisms: conduction through the seed and convection/radiation at the melt surface.

Figure 6:
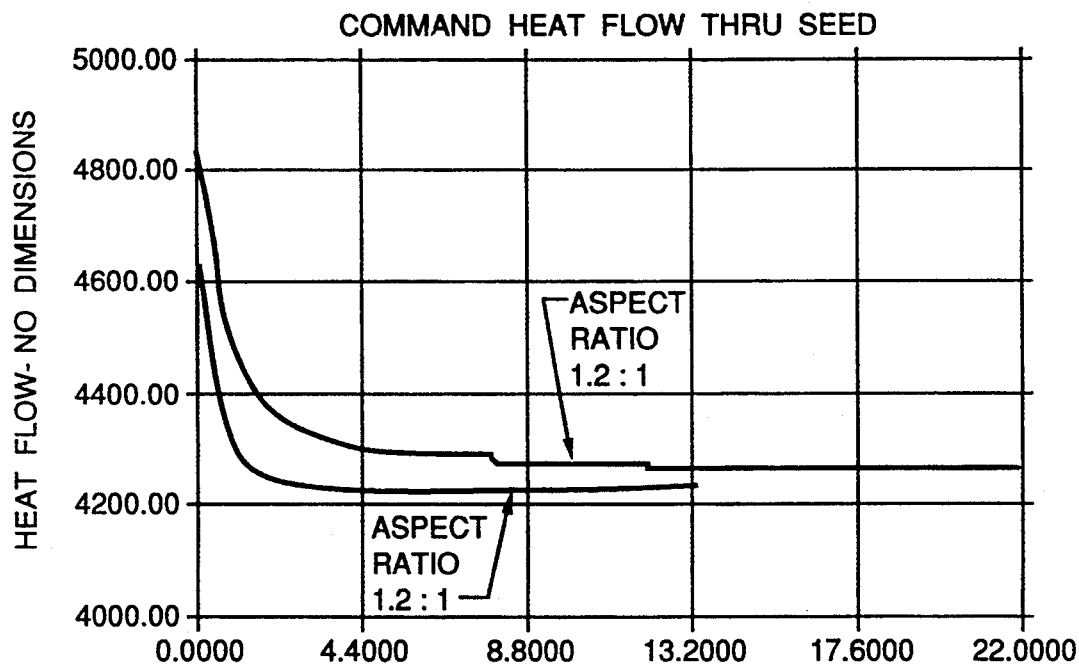
FIG. 6 illustrates calculated heat flow through the seed as a function of crystal radius.
Figure 7:
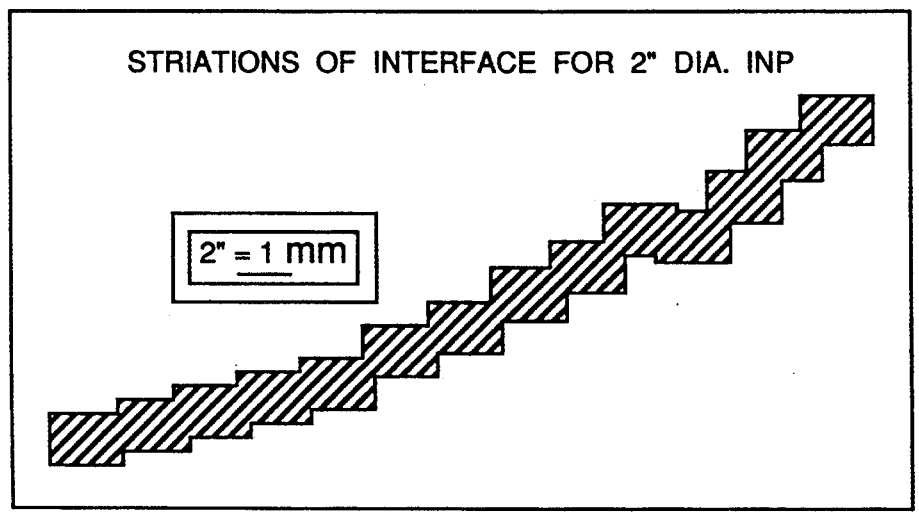
FIG. 7 illustrates striations showing interface shape for a 2-in dia. InP crystal of the present invention.

As a test of this approach, the aspect ratio of crystals is measured at various points during growth. The height and width of the crystal ellipsoid is taken from the transmission infrared images of the dopant striations as seen in cross section. An aspect ratio for the ellipsoid is determined. The model is used to determine heat flow through the seed for a crystal of this aspect ratio. For crystals grown under different conditions, the ellipsoid takes a different shape. When the seed temperature $T_o$ is held very low, the crystal approaches a spherical shape. The model can be used to show the relationship between heat flow and crystal shape. FIG. 6 shows the calculated heat flow through the seed for two crystals grown under different experimental conditions, first a crystal with an aspect ratio of 1:1.2 (an ellipsoid) and second, a flatter crystal (aspect ratio 1:1.3). The model shows much greater heat flow through the seed for the case of the first crystal with the more spherical shape. However, conductive heat flow in both cases reaches a saturation point very quickly, when the crystal radius reaches 6–8 mm. After the crystal has grown to this size, convective heat flow from the melt surface begins to dominate the growth process. FIG. 7 illustrates the shape of the growing crystal; this composite micrograph is an infrared image of the growth interface for a crystal two inches in diameter. The high pressure ambient acts as an effective heat sink causing the crystal to grow laterally unless measures are taken to reduce surface heat losses. An axial magnetic field of 2 kG is sufficient to control the radial temperature gradient so that the crystal will grow in a controlled fashion to the full diameter of 2 inches.

Clearly, many modifications and variations of the present invention are possible in light of the above teachings and it is therefore understood, that within the inventive scope of the inventive concept, the invention may be practiced otherwise than specifically claimed.

What is claimed is:

1. A process for growing a twin-free single crystal of III–V compounds with no probability of twinning in said crystal, said process comprising the steps of:
   providing a stoichiometric amount of the III–V compounds in a crystal growth furnace;
   providing an encapsulant over said stoichiometric amount in a crucible in the furnace;
   pressurizing a chamber of the furnace;
   heating said stoichiometric amount to provide a melt in said crucible;
   heating the encapsulant to cover the melt;
   applying an axial magnetic field to the melt;
   inserting a III–V compound seed into the melt under the encapsulant;
   rotating the seed under the encapsulant in the melt;
   growing a crystal on the seed having a flat crown under the rotating encapsulant;
   observing the flat crown, during said growing, for twins under the encapsulant by use of a high intensity light beam reflected off the flat crown, said observing being from a side of the furnace opposite to a high intensity light source outputting the high intensity light beam;
   continuing growing the crystal during the observing if no twins are observed on the flat crown until the diameter of the crystal is in close proximity to a wall of said crucible, to maximize the crystal for potential wafer use;
   pulling the twin free crystal from the melt and encapsulant to produce a single crystal of cylindrical shape with a flat top;
   cooling the crystal; and
   removing the twin free crystal from the furnace;
   if, during said step of observing of the flat crown under the high intensity light beam, twins are observed, then backmelting the crystal including the flat crown to remove the twins;
   continuing growing the crystal during the observering if no further twins are observed on the flat crown until the diameter of the crystal is in close proximity to a wall of said crucible, to maximize the crystal for potential wafer use;
   pulling the crystal from the melt and encapsulant to produce a single crystal of cylindrical shape with a flat top;
   cooling the crystal; and
   removing the twin free crystal from the furnace.

2. A process as defined in claim 1 wherein the III–V compounds are indium and phosphorous.

3. A process as defined in claim 1 wherein the chamber is pressurized to about 500 psi.

4. A process as defined in claim 3 wherein a gas for pressurizing is nitrogen.

5. A process as defined in claim 1 wherein the encapsulant is $B_2O_3$.

6. A process as defined in claim 1 wherein the melt is at a temperature of about 1100° C.

7. A process as defined in claim 6 wherein said pulling occurs in about a 20° C./cm axial gradient.

8. A process as defined in claim 1 wherein the axial magnetic field reduces the melt turbulence.

9. A process as defined in claim 8 wherein the axial magnetic field is about 2 kG.

10. A process as defined in claim 9 wherein temperature fluctuations are less than 1° C. as the magnetic field exceeds 1 kG.

11. A process as defined in claim 1 wherein the seed has a (100) orientation.

12. A process as defined in claim 1 wherein said pulling is at a rate of about 12 mm/hr.

13. A process as defined in claim 1 wherein the furnace is made of non-magnetic stainless steel.

14. A process as defined in claim 1 wherein crystal growth occurs because of seed cooling.

* * * * *